(12) United States Patent
Rachkov

(10) Patent No.: US 8,715,458 B2
(45) Date of Patent: May 6, 2014

(54) ADJUSTABLE MICRO DEVICE FEEDER SYSTEM AND METHOD OF OPERATION THEREOF

(75) Inventor: Rossen Atanassov Rachkov, Kenmore, WA (US)

(73) Assignee: Data I/O Corporation, Redmond, WA (US)

( * ) Notice: Subject to any disclaimer, the term of this patent is extended or adjusted under 35 U.S.C. 154(b) by 558 days.

(21) Appl. No.: 12/485,776

(22) Filed: Jun. 16, 2009

(65) Prior Publication Data

US 2009/0308717 A1 Dec. 17, 2009

Related U.S. Application Data

(60) Provisional application No. 61/061,793, filed on Jun. 16, 2008.

(51) Int. Cl.
*B65H 5/28* (2006.01)
*B32B 38/10* (2006.01)

(52) U.S. Cl.
USPC ........... 156/714; 156/764; 156/930; 156/941; 221/25; 221/79; 221/87; 414/416.05

(58) Field of Classification Search
USPC ........ 156/714, 764, 930, 941; 221/25, 72, 73, 221/79, 87; 414/411, 416.01, 416.03, 414/416.05, 416.08, 425, 811, 412
See application file for complete search history.

(56) References Cited

U.S. PATENT DOCUMENTS

| | | | | | |
|---|---|---|---|---|---|
| 4,768,915 | A | * | 9/1988 | Fujioka | 414/416.08 |
| 5,191,693 | A | * | 3/1993 | Umetsu | 29/429 |
| 5,531,859 | A | * | 7/1996 | Lee et al. | 156/765 |
| 5,725,140 | A | * | 3/1998 | Weber et al. | 226/139 |
| 6,082,954 | A | * | 7/2000 | Foster | 414/416.05 |
| 7,472,737 | B1 | * | 1/2009 | Rachkov | 156/539 |
| 8,079,396 | B2 | * | 12/2011 | Rachkov | 156/539 |

FOREIGN PATENT DOCUMENTS

JP 10139272 A * 5/1998

* cited by examiner

*Primary Examiner* — Mark A Osele
(74) *Attorney, Agent, or Firm* — Ishimaru & Associates LLP

(57) ABSTRACT

A method of operation of a micro device feeder system includes: adjusting a distance between a movable drive plate and a mounting plate for aligning a carrier tape carrying a micro device to a center line for pick-up of the micro device by external device handling equipment; and configuring a tape handling mechanism, having a sprocket assembly, to accommodate a predetermined width of the carrier tape.

20 Claims, 4 Drawing Sheets

ADJUSTABLE MICRO DEVICE FEEDER SYSTEM AND METHOD OF OPERATION THEREOF

CROSS-REFERENCE TO RELATED APPLICATION(S)

This application claims the benefit of U.S. Provisional Patent Application Ser. No. 61/061,793 filed Jun. 16, 2008, and the subject matter thereof is incorporated herein by reference thereto.

TECHNICAL FIELD

The present invention relates generally to manufacturing system for electronic products, and more particularly to a micro device feeder system used in a manufacturing system.

BACKGROUND ART

Certain operations of electronic circuit board assembly involved supplying micro devices by a micro device feeder to a robotic handling system. The micro devices include a broad range of electronic and mechanical devices, such as programmable devices. Programmable devices, include but are not limited to devices such as Flash memories (Flash), electrically erasable programmable read only memories ($E^2PROM$), programmable logic devices (PLDs), field programmable gate arrays (FPGAs), and microcontrollers incorporating non-volatile memory elements.

The micro device feeders are generally aligned and connected underneath a robotic handling system. The micro devices are typically supplied in tape on reel. The tape includes a plurality of pockets for containing the micro devices. Typically, there is only one pocket across the width of the tape. The tape has sprocket holes or perforations in one side or both sides so that it can be driven through the micro device feeder.

The robotic handling system removes the micro devices as the micro device feeder in the tape linearly presents them and places them on buffer areas of the micro device feeder or directly on printed circuit boards moving through an electronic assembly line or manufacturing system. Linearly moving pick-and-place mechanisms are sometimes employed as robot handling systems in high-speed electronic assembly lines. In such a system, the centerline of the linearly moving pick-and-place mechanism must coincide with the centerline of the pockets in the linearly moving tape.

A major problem associated with the handling of micro devices carried on tapes is that different micro device feeders are needed for different size micro devices because they must be supplied in different size tapes. For example, three different micro device feeders are required for 16-, 24-, and 32-millimeter wide tape.

Since most companies have to handle different size micro devices supplied in tapes with different widths, they require a large number of different size micro device feeders, which is quite inconvenient and expensive.

Different approaches have been taken to try to solve this problem. One approach involves using a tape module, which forms a portion of the micro device feeder. The tape module is replaced for supplying micro devices contained in tapes with different widths. Therefore, instead of replacing the entire micro device feeder to accommodate for different size tape, only the corresponding tape module needs to be replaced. However, the tape module often constitutes almost half of the mechanism of a micro device feeder so it is still inconvenient and expensive to stock large number of tape modules to handle different size tapes.

Thus, a need remains for providing a micro device feeder, which is easily adjustable to accommodate micro devices supplied on tapes with different widths, that is simple and inexpensive. In view of the increased demand for low-cost and efficient manufacturing of electronic products, including electronic circuit board assembly, it is increasingly critical that answers be found to this problem.

Solutions to this problem have been long sought but prior developments have not taught or suggested any solutions and, thus, solutions to this problem have long eluded those skilled in the art.

DISCLOSURE OF THE INVENTION

The present invention provides a method of operation of a micro device feeder system including: adjusting a distance between a movable drive plate and a mounting plate for aligning a carrier tape carrying a micro device to a center line for pick-up of the micro device by external device handling equipment; and configuring a tape handling mechanism, having a sprocket assembly, to accommodate a predetermined width of the carrier tape.

In addition, the present invention provides a micro device feeder system including: a movable drive plate and a mounting plate separated by a distance selected for aligning a carrier tape carrying a micro device to a center line for pick-up of the micro device by external device handling equipment; and a tape handling mechanism, having a sprocket assembly, for accommodating a predetermined width of the carrier tape.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
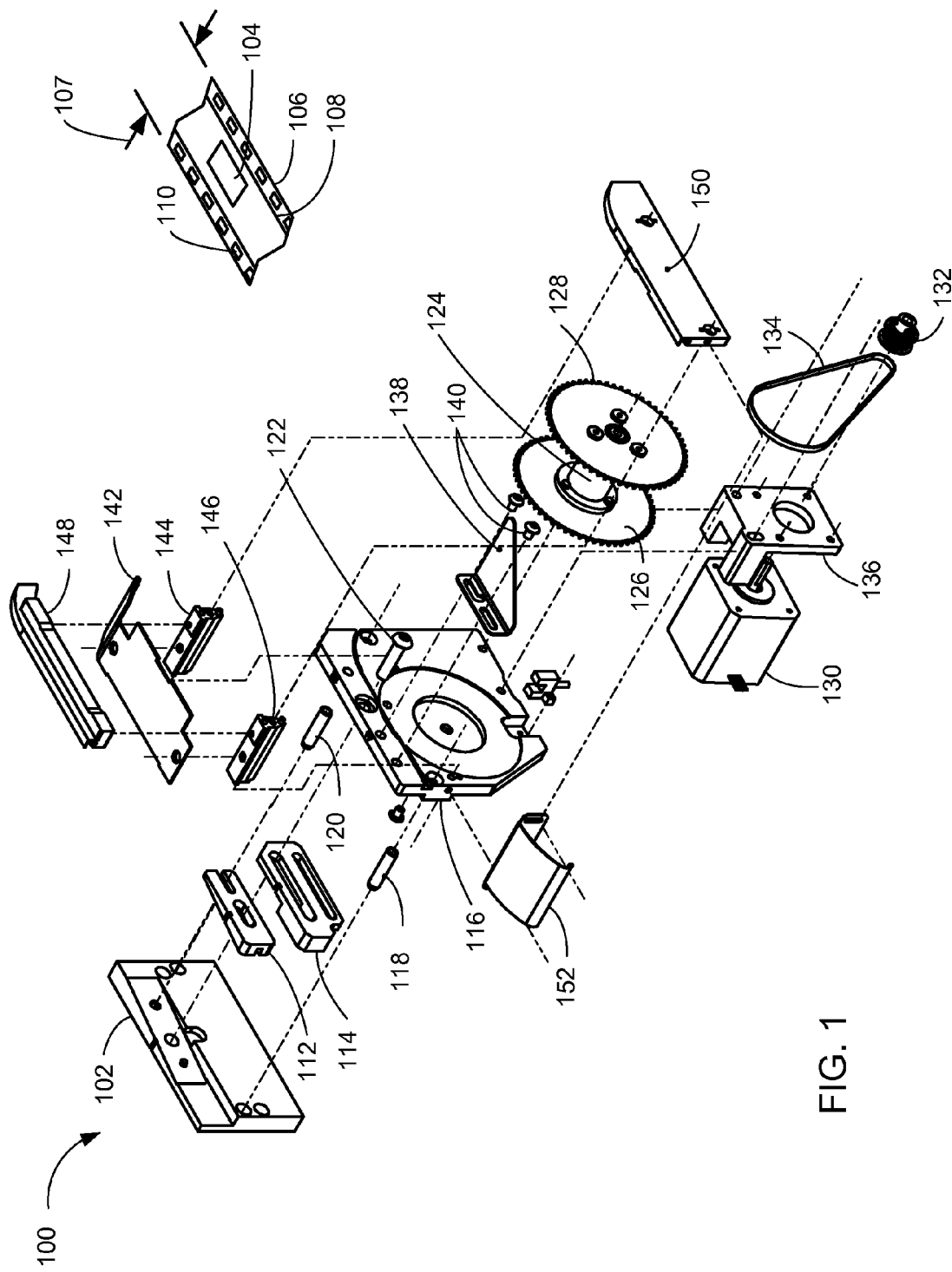
FIG. 1 is an exploded isometric view of a micro device feeder system constructed according to the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown exaggerated in the drawing FIGs.

In addition, where multiple embodiments are disclosed and described having some features in common, for clarity and ease of illustration, description, and comprehension thereof, similar and like features one to another will ordinarily be described with like reference numerals.

Referring now to FIG. 1, therein is shown an exploded isometric view of a micro device feeder system 100 constructed according to the present invention. The term "horizontal" as used herein is defined as a direction parallel to the direction defined by the longest side of a mounting plate 102, regardless of its orientation. The term "vertical" refers to a direction perpendicular to the horizontal as just defined. Terms, such as "on", "above", "below", "bottom", "top", "side", "higher", "lower", "over", and "under", are defined with respect to the horizontal plane.

The micro device feeder system 100 is designed to handle a micro device 104 supplied on a carrier tape 106 with a width 107. The carrier tape 106 includes a pocket (not shown) for containing the micro device 104 and a cover tape 108 covering the micro device 104. Typically, there is only one pocket across the width 107 of the carrier tape 106. The carrier tape 106 has sprocket perforations 110 on one or both sides so that it can be driven through the micro device feeder system 100.

The mounting plate 102 is a fixture for attaching the micro device feeder system 100 to a machine frame (not shown). A wedge slider 112 and a two-position spacer 114 are positioned between the mounting plate 102 and a movable drive plate 116. A first guide pin 118 and a second guide pin 120 align the movable drive plate 116 to the mounting plate 102. A screw 122 secures the movable drive plate 116 to the mounting plate 102.

The position of the movable drive plate 116 in reference to the mounting plate 102 is determined by the positioning of the wedge slider 112 and by sliding the two-position spacer 114, between the movable drive plate 116 and the wedge slider 112, to one of two pre-determined positions in reference to the mounting plate 102. Thus by loosening the screw 122, it is possible to move the wedge slider 112 in the horizontal direction, providing fine adjustment of the distance between the movable drive plate 116 and the mounting plate 102 to accommodate for manufacturing tolerances.

The micro device feeder system 100 relies on a sprocket assembly 124, which engages the sprocket perforations 110 in the carrier tape 106 with the micro device 104 to linearly drive it through the micro device feeder system 100. In the preferred embodiment of the invention the sprocket assembly 124 includes a first sprocket 126 and a second sprocket 128. The carrier tape 106 may be driven through the micro device feeder system 100 using only the first sprocket 126 or both the first sprocket 126 and the second sprocket 128.

Rotation of the sprocket assembly 124 is driven by a motor 130 through a motor pulley 132 and a drive belt 134. The motor 130 is mounted on a motor bracket 136, which is in turn attached to the movable drive plate 116.

A cover tape removal mechanism 138 such as a peel bar removes the cover tape 108 protecting the micro device 104 mounted on the carrier tape 106. Removal of the cover tape 108 exposes the micro device 104 for handling by the external pick and place system (not shown). The cover tape removal mechanism 138 is attached to the movable drive plate 116 using screws 140. As would be evident to those skilled in the art, the cover tape removal mechanism 138 may also be implemented using a roller or other mechanisms suitable for removing the cover tape.

The micro device feeder system 100 includes a cover plate 142 attached to a first cover plate support 144 and a second cover plate support 146. The first cover plate support 144 and the second cover plate support 146 are attached to the movable drive plate 116. A first tape guide 148, such as an inner tape guide, is attached to the top of the cover plate 142, preferably using a magnet (not shown) to allow for ease of placement and removal of the first tape guide 148. A second tape guide 150, such as an outer tape guide, is connected to the tips of the first cover plate support 144 and the second cover plate support 146. The first tape guide 148 can be between the second tape guide 150 and the movable drive plate 116. The second tape guide 150 is fixed relative to the movable drive plate 116 through connection to the first cover plate support 144 and the second cover plate support 146. A tape guide 152 is attached to the movable drive plate 116.

Figure 2:
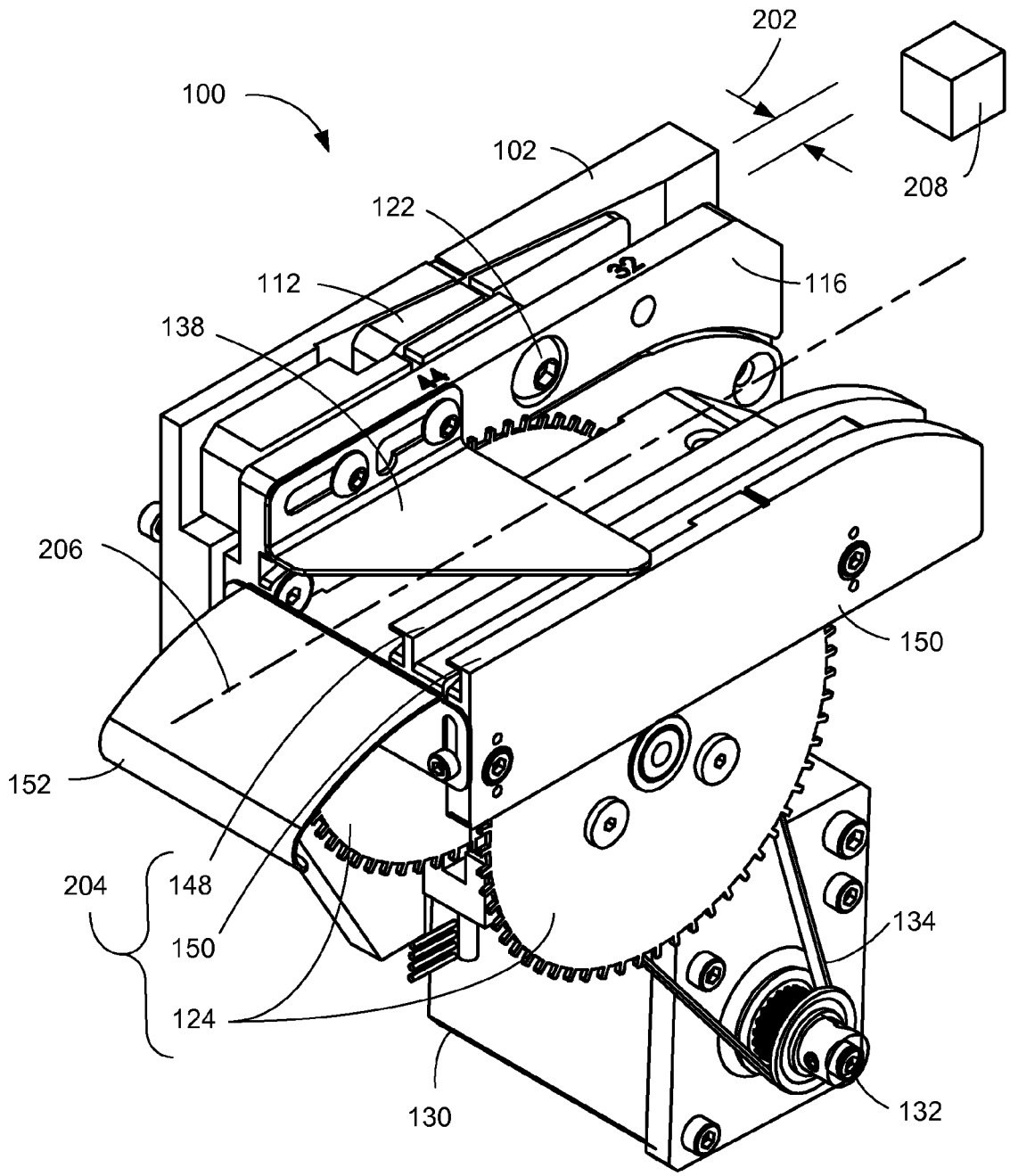
FIG. 2 is an isometric view of the micro device feeder system of FIG. 1.

Referring now to FIG. 2, therein is shown an isometric view of the micro device feeder system 100 of FIG. 1. Prior to use, the micro device feeder system 100 is configured for the width 107 of the carrier tape 106 shown in FIG. 1. The configuration process includes two steps: adjusting a distance 202 between the movable drive plate 116 and the mounting plate 102, and setting up a tape handling mechanism 204 for operation with the carrier tape 106 with the width 107 shown in FIG. 1. The term "tape handling mechanism" as used herein is a sub-assembly of the micro device feeder system 100 that includes the first tape guide 148, the second tape guide 150, and the sprocket assembly 124.

The tape handling mechanism 204 is configured to handle one of two predetermined widths of the carrier tape 106. One configuration of the tape handling mechanism 204 includes attaching the first tape guide 148 the top of the cover plate 142, only exposing the first sprocket 126 for driving the carrier tape 106 through the tape handling mechanism 204. A second configuration of the tape handling mechanism 204 does not use the first tape guide 148, and thus both the first sprocket 126 and the second sprocket 128 drive the carrier tape 106 through the tape handling mechanism 204.

The distance 202 between the movable drive plate 116 and the mounting plate 102 is adjusted by loosening the screw 122 and moving the two-position spacer 114 horizontally to one of two fixed positions. The positions of the first tape guide 148 and the second tape guide 150 are pre-determined to accommodate two selections of the width 107 of the carrier tape 106 shown in FIG. 1.

It has been discovered that the positioning provided by the two-position spacer 114 and the configuration choices provided the first tape guide 148 and the second tape guide 150, enable aligning the carrier tape 106 to a centerline 206 of external device handling equipment 208 and solve the problem of having to exchange the entire micro device feeder system 100 for each width of the carrier tape 106.

The carrier tape 106 moves through the micro device feeder system 100 from left to right in FIG. 2, exiting at the far end of the tape guide 152. Motion of the carrier tape 106 may be imparted by a "dual drive system" consisting of the sprocket assembly 124 shown in FIG. 1, the drive belt 134, the motor 130, and the motor pulley 132. As the carrier tape 106 moves from left to right through the micro device feeder system 100 the cover tape removal mechanism 138 peels the cover tape 108 from the carrier tape 106, exposing the micro device 104 for handling by an external pick and place system (not shown). The cover tape is pulled and collected by an external device (not shown).

Figure 3:
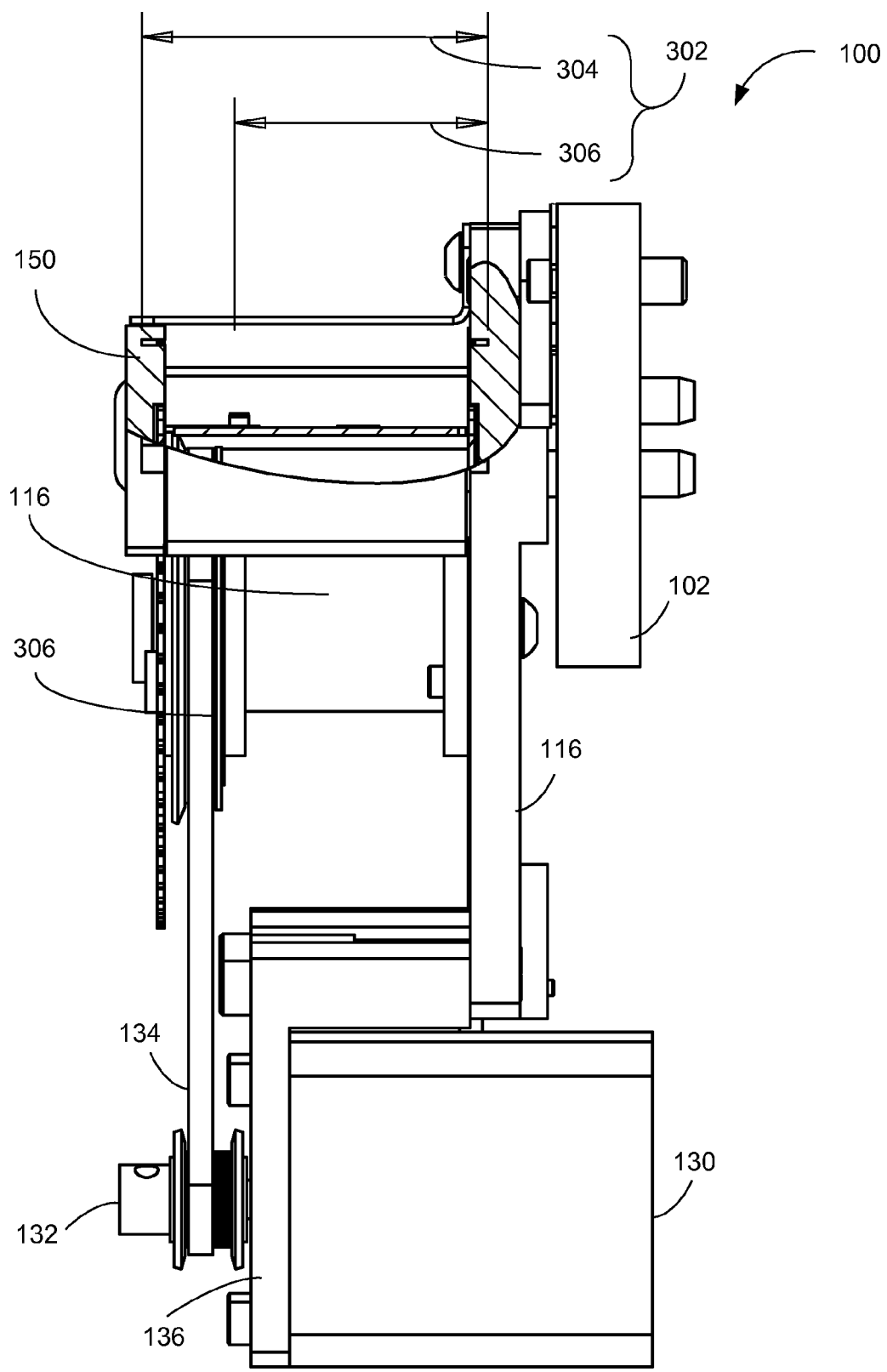
FIG. 3 is side view of the micro device feeder system of FIG. 1.

Referring now to FIG. 3, therein is shown is side view of the micro device feeder system 100 of FIG. 1. The mounting plate 102 supports the movable drive plate 116 and the motor bracket 136. The micro device feeder system 100 accepts the carrier tape 106 of a predetermined width 302. In the preferred embodiment of the invention, the micro device feeder system 100 accepts a first tape width 304 determined by the distance between the movable drive plate 116 and the first tape guide 148 shown in FIG. 2, and a second tape width 306 determined by the distance between the movable drive plate 116 and the second tape guide 150.

The sprocket assembly 124 of FIG. 2 includes a sprocket pulley 306. Rotation of the sprocket assembly 124 is driven by the motor 130 through the drive belt 134 connected between the motor pulley 132 and the sprocket pulley 306.

Figure 4:
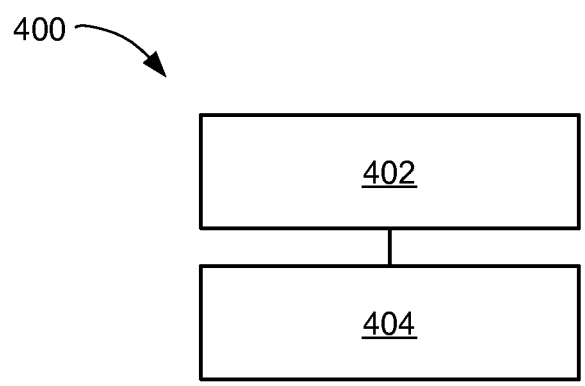
FIG. 4 is a flow chart of a method of operation of the micro device feeder system in a further embodiment of the present invention.

Referring now to FIG. 4, therein is shown a flow chart of a method 400 of operation of the micro device feeder system 100 in a further embodiment of the present invention. The method 400 includes adjusting a distance between a movable drive plate and a mounting plate for aligning a carrier tape carrying a micro device to a center line for pick-up of the micro device by external device handling equipment in a block 402; and configuring a tape handling mechanism, having a sprocket assembly, to accommodate a predetermined width of the carrier tape in a block 404.

It has been discovered that the micro device feeder system of the present invention furnishes important and heretofore unknown and unavailable solutions, capabilities, and functional aspects for handling micro devices supplied on a tape.

The resulting processes and configurations are straightforward, cost-effective, uncomplicated, highly versatile and effective, can be surprisingly and unobviously implemented by adapting known technologies, and are thus readily suited for efficiently and economically manufacturing semiconductor packages fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of operation of a micro device feeder system comprising:
adjusting a distance between a movable drive plate and a mounting plate with a two-position spacer and a wedge slider between the movable drive plate and the mounting plate for aligning a carrier tape carrying a micro device to a center line for pick-up of the micro device by external device handling equipment; and
configuring a tape handling mechanism having a sprocket assembly and an outer tape guide fixed in relation to the movable drive plate through connection to a first cover plate support, to accommodate a predetermined width of the carrier tape, the sprocket assembly to engage sprocket perforations of the carrier tape driven by a first sprocket and a second sprocket of the sprocket assembly, the first cover plate support and a second cover plate support attached to the movable drive plate, a cover plate attached to the first cover plate support and the second cover plate support.

2. The method as claimed in claim 1 wherein adjusting the distance between the movable drive plate and the mounting plate for aligning the carrier tape with the width to the center line for pick-up by external device handling equipment includes moving a two-position spacer.

3. The method as claimed in claim 1 wherein configuring the tape handling mechanism, having the sprocket assembly, to accommodate the predetermined width of the carrier tape includes configuring the tape handling mechanism for a selection of a first tape width or a second tape width.

4. The method as claimed in claim 1 wherein configuring the tape handling mechanism includes installing an inner tape guide, of the tape handling mechanism, between the movable drive plate and the outer tape guide to expose only the first sprocket.

5. The method as claimed in claim 4 further comprising engaging a carrier tape with sprocket perforations, on one side, to the first sprocket.

6. A method of operation of a micro device feeder system comprising:
sliding a two-position spacer and a wedge slider to adjust a distance between a movable drive plate and a mounting plate for aligning a carrier tape carrying a micro device to a center line for pick-up of the micro device by external device handling equipment, the wedge slider between the movable drive plate and the mounting plate;
configuring a tape handling mechanism having a sprocket assembly and an outer tape guide fixed in relation to the movable drive plate through connection to a first cover plate support, to accommodate a predetermined width of the carrier tape, the first cover plate support and a second cover plate support attached to the movable drive plate, a cover plate attached to the first cover plate support and the second cover plate support; and
driving the carrier tape by sprocket perforations of the carrier tape engaged with a first sprocket and a second sprocket of the sprocket assembly.

7. The method as claimed in claim 6 further comprising using a cover tape removal mechanism to remove a cover tape protecting the micro device mounted on the carrier tape.

8. The method as claimed in claim 6 wherein driving the carrier tape through the micro device feeder system by engaging sprocket perforations in the carrier tape using the sprocket assembly is done using a motor connected to the sprocket assembly through a drive belt.

9. The method as claimed in claim 6 further comprising driving a carrier tape having sprocket perforations on one side, through the micro device feeder system, by engaging the sprocket perforations with the sprocket assembly.

10. The method as claimed in claim 6 wherein moving the two-position spacer includes moving the two-position spacer horizontally to one of two fixed positions.

11. A micro device feeder system comprising:
a movable drive plate and a mounting plate separated by a distance selected for aligning a carrier tape carrying a micro device to a center line for pick-up of the micro device by external device handling equipment;
a two-position spacer between the movable drive plate and the mounting plate;
a wedge slider adjacent the two-position spacer and between the movable drive plate and the mounting plate;
a first cover plate support and a second cover plate support attached to the movable drive plate;
a cover plate attached to the first cover plate support and the second cover plate support; and
a tape handling mechanism having a sprocket assembly and an outer tape guide fixed in relation to the movable drive plate through connection to the first cover plate support, for accommodating a predetermined width of the carrier tape, the sprocket assembly engaged to sprocket perforations of the carrier tape driven by a first sprocket and a second sprocket of the sprocket assembly for driving the carrier tape.

12. The system as claimed in claim 11 wherein the two-position spacer is for adjusting the distance between the movable drive plate and the wedge slider.

13. The system as claimed in claim 11 wherein the predetermined width of the carrier tape is a selection of a first tape width or a second tape width.

14. The system as claimed in claim 11 wherein the tape handling mechanism includes an inner tape guide distanced between the movable drive plate and the outer tape guide to expose only the first sprocket.

15. The system as claimed in claim 14 further comprising a carrier tape with sprocket perforations, on one side, engaged to the first sprocket.

16. The system as claimed in claim 11 wherein the two-position spacer is for slidably adjusting the distance between the movable drive plate and the mounting plate.

17. The system as claimed in claim 16 further comprising a cover tape removal mechanism for removing a cover tape protecting the micro device mounted on the carrier tape.

18. The system as claimed in claim 16 further comprising a motor connected to the sprocket assembly through a drive belt.

19. The system as claimed in claim 18 further comprising a motor pulley driven by the motor connected to the sprocket assembly through the drive belt to rotate the sprocket assembly.

20. The system as claimed in claim 16 wherein the two-position spacer and the wedge slider are between the mounting plate and the movable drive plate.

\* \* \* \* \*